United States Patent [19]

Batcher

[11] 4,314,349

[45] Feb. 2, 1982

[54] PROCESSING ELEMENT FOR PARALLEL ARRAY PROCESSORS

[75] Inventor: Kenneth E. Batcher, Stow, Ohio

[73] Assignee: Goodyear Aerospace Corporation, Akron, Ohio

[21] Appl. No.: 108,883

[22] Filed: Dec. 31, 1979

[51] Int. Cl.³ .............................................. G06F 15/16
[52] U.S. Cl. .................................. 364/716; 364/738; 364/900; 371/9
[58] Field of Search ............... 364/716, 738, 200, 900; 371/49, 9, 10

[56] References Cited

U.S. PATENT DOCUMENTS

| | | | |
|---|---|---|---|
| 3,296,426 | 1/1967 | Ball | 364/716 |
| 3,313,926 | 4/1967 | Minnick | 364/716 |
| 3,364,472 | 1/1968 | Sloper | 364/716 |
| 3,602,886 | 8/1971 | Carter | 371/49 |
| 3,701,976 | 10/1972 | Shively | 364/200 |
| 3,979,728 | 9/1976 | Reddaway | 364/200 |
| 4,037,094 | 7/1977 | Vandierendonck | 364/716 |
| 4,051,354 | 9/1977 | Choate | 371/10 |
| 4,065,808 | 12/1977 | Schomberg et al. | 364/200 |
| 4,144,566 | 3/1979 | Timsit | 364/200 |
| 4,207,556 | 6/1980 | Sugiyama et al. | 364/716 |

*Primary Examiner*—Charles E. Atkinson
*Attorney, Agent, or Firm*—P. E. Milliken; E. W. Oldham; R. L. Weber

[57] ABSTRACT

A processing element constituting the basic building block of a massively-parallel processor. Fundamentally, the processing element includes an arithmetic sub-unit comprising registers for operands, a sum-bit register, a carry-bit register, a shift register of selectively variable length, and a full adder. A logic network is included with each processing element for performing the basic Boolean logic functions between two bits of data. There is also included a multiplexer for intercommunicating with neighboring processing elements and a register for receiving data from and transferring data to neighboring processing elements. Each such processing element includes its own random access memory which communicates with the arithmetic sub-unit and the logic network of the processing element.

15 Claims, 8 Drawing Figures

PROCESSING ELEMENT FOR PARALLEL ARRAY PROCESSORS

BACKGROUND OF THE INVENTION

The invention described herein was made in the performance of work under NASA Contract No. NAS 5-25392 and is subject to the provisions of § 305 of the National Aeronautics and Space Act of 1958 (72 Stat. 435; 42 U.S.C. 2457).

The instant invention resides in the art of data processors and, more particularly, with large scale parallel processors capable of handling large volumes of data in a rapid and cost-effective manner. Presently, the demands on data processors are such that large pluralities of data must be arithmetically and logically processed in short periods of time for purposes of constantly updating previously obtained results or, alternatively, for monitoring large fields from which data may be acquired and in which correlations must be made. For example, this country is presently intending to orbit imaging sensors which can generate data at rates up to $10^{13}$ bits per day. For such an imaging system, a variety of image processing tasks such as geometric correction, correlation, image registration, feature selection, multispectral classification, and area measurement are required to extract useful information from the mass of data obtained. Indeed, it is expected that the work load for a data processing system utilized in association with such orbiting image sensors would fall somewhere between $10^9$ and $10^{10}$ operations per second.

High speed processing systems and sophisticated parallel processors, capable of simultaneously operating on a plurality of data, have been known for a number of years. Indeed, applicant's prior U.S. Pat. Nos. 3,800,289; 3,812,467; and 3,936,806, all relate to a structure for vastly increasing the data processing capability of digital computers. Similarly, U.S. Pat. No. 3,863,233, assigned to Goodyear Aerospace Corporation, the assignee of the instant application, relates specifically to a data processing element for an associative or parallel processor which also increases data processing speed by including a plurality of arithmetic units, one for each word in the memory array. However, even the great advancements of these prior art teachings do not possess the capability of cost effectively handling the large volume of data previously described. A system of the required nature includes thousands of processing elements, each including its own arithmetic and logic network operating in conjunction with its own memory, while possessing the capability of communicating with other similar processing elements within the system. With thousands of such processing elements operating simultaneously (massive-parallelism), the requisite speed may be achieved. Further, the fact that typical satellite images include millions of picture elements or pixels that can generally be processed at the same time, such a structure lends itself well to the solution of the aforementioned problem.

In a system capable of processing a large volume of data in a massively-parallel manner, it is most desirable that the system be capable of performing bit-serial mathematics for cost effectiveness. However, in order to increase speed in the bit-several computation, it is most desirable that a variable length shift register be included such that various word lengths may be accommodated. Further, it is desirable that the massive array of processing elements be capable of intercommunication such that data may be moved between and among at least neighboring processing elements. Further, it is desirable that each processing element be capable of performing all of the Boolean operations possible between two bits of data, and that each such processing element include its own random access memory. Yet further, for such a system to be efficient, it should include means for bypassing inoperative or malfunctioning processing elements without diminishing system integrity.

OBJECTS OF THE INVENTION

In light of the foregoing, it is an object of an aspect of the invention to provide a plurality of processing elements for a parallel array processor wherein each such element includes a variable length shift register for at least assisting in arithmetic computations.

Yet another object of an aspect of the invention is to provide a plurality of processing elements for a parallel array processor wherein each such processing element is capable of intercommunicating with at least certain neighboring processing elements.

Still another object of an aspect of the invention is to provide a plurality of processing elements for a parallel array processor wherein each such processing element is capable of performing bit-serial mathematical computations.

An additional object of an aspect of the invention is to provide a plurality of processing elements for a parallel array processor wherein each such processing element is capable of performing all of the Boolean functions capable of being performed between two bits of binary data.

Yet a further object of an aspect of the invention is to provide a plurality of processing elements for a parallel array processor wherein each such processing element includes its own memory and data bus.

Still a further object of an aspect of the invention is to provide a plurality of processing elements for a parallel array processor wherein certain of said processing elements may be bypassed should they be found to be inoperative or malfunctioning, such bypassing not diminishing the system integrity.

Yet another object of an aspect of the invention is to provide a plurality of processing elements for a parallel array processor which achieves cost-effective processing of a large plurality of data in a time-efficient manner.

SUMMARY OF THE INVENTION

The foregoing and other objects of aspects of the invention are achieved by a matrix of a plurality of processing elements interconnected with each other and wherein each such processing element comprises: a memory; an adder; and communication means connected to neighboring processing elements within said matrix and further connected to said adder and memory for transferring data between said memory, adder, and neighboring processing elements.

DESCRIPTION OF DRAWINGS

For a complete understanding of the objects, techniques, and structure of the invention, reference should be had to the following detailed description and accompanying drawings wherein:

FIG. 5, comprising FIGS. 5A and 5B, presents circuit schematics of the switching circuitry utilized in removing an inoperative or malfunctioning processing element from the array unit.

DETAILED DESCRIPTION OF PREFERRED EMBODIMENT

Figure 1:
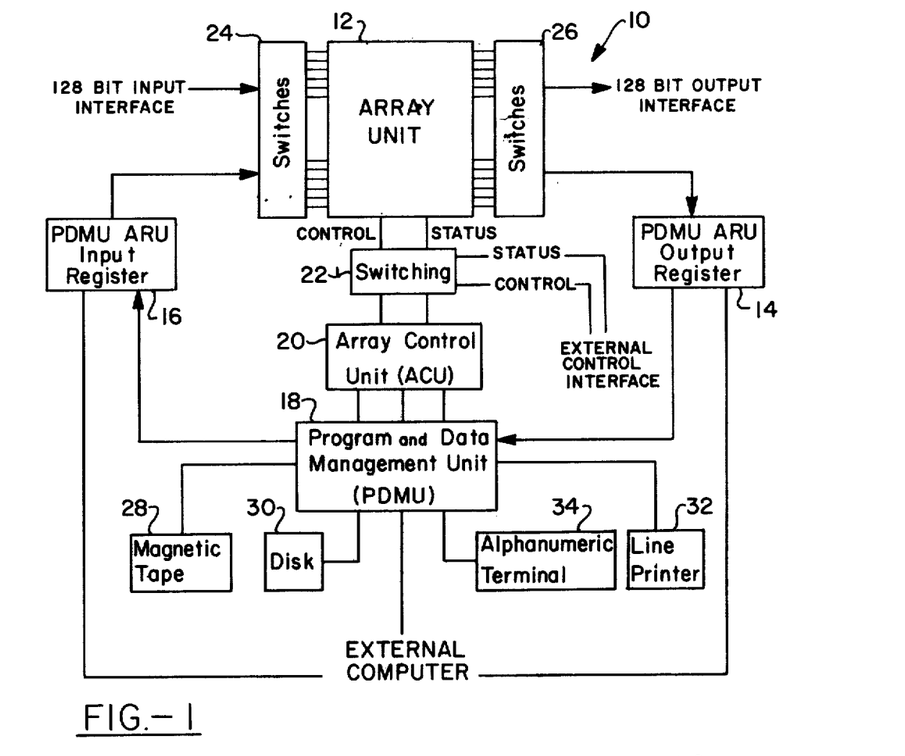
FIG. 1 is a block diagram of a massively-parallel processing system according to the invention, showing the interconnection of the array unit incorporating a plurality of processing elements.

Referring now to the drawings and more particularly FIG. 1, it can be seen that a massively-parallel processor is designated generally by the numeral 10. A key element of the processor 10 is the array unit 12 which, in a preferred embodiment of the invention, includes a matrix of 128×128 processing elements, for a total of 16,384 processing elements, to be described in detail hereinafter. The array unit 12 inputs data on its left side and outputs data on its right side over 128 parallel lines. The maximum transfer rate of 128-bit columns of data is 10 mhz for a maximum bandwidth of 1.28 billion bits per second. Input, output, or both, can occur simultaneously with processing.

Electronic switches 24 select the input of the array unit 12 from the 128-bit interface of the processor 10, or from the input register 16. Similarly, the array 12 output may be steered to the 128-bit output interface of the processor 10 or to the output register 14 via switches 26. These switches 24,26 are controlled by the program and data management unit 18 under suitable program control. Control signals to the array unit 12 and status bits from the array unit may be connected to the external control interface of the processor 10 or to the array control unit 20. Again, this transfer is achieved by electronic switches 22, which are under program control of the unit 18.

The array control unit 20 broadcasts control signals and memory addresses to all processing elements of the array unit 12 and receives status bits therefrom. It is designed to perform bookkeeping operations such as address calculation, loop control, branching, subroutine calling, and the like. It operates simultaneously with the processing element control such that full processing power of the processing elements of the array unit 12 can be applied to the data to be handled. The control unit 20 includes three separate control units; the processing element control unit executes micro-coded vector processing routines and controls the processing elements and their associated memories; the input/output control unit controls the shifting of data through the array unit 12; and the main control unit executes the application programs, performs the scaler processing internally, and makes calls to the processing element control unit for all vector processing.

The program and data management unit 18 manages data flow between the units of the processor 10, loads programs into the control unit 20, executes system tests and diagnostic routines, and provides program development facilities. The details of such structure are not important for an understanding of the instant invention, but it should be noted that the unit 18 may readily comprise a mini-computer such as the Digital Equipment Corporation (DEC) PDP-11/34 with interfaces to the control unit 20, array unit 12 (registers 14,16), and the external computer interface. As is well known in the art, the unit 18 may also include peripheral equipment such as magnetic tape drive 28, disks 30, a line printer 32, and an alphanumeric terminal 34.

While the structure of FIG. 1 is of some significance for an appreciation of the overall system incorporating the invention, it is to be understood that the details thereof are not necessary for an appreciation of the scope and breadth of applicant's inventive concept. Suffice it to say at this time that the array unit 12 comprises the inventive concept to be described in detail herein and that such array includes a large plurality of interconnected processing elements, each of which has its own local memory, is capable of performing arithmetic computations, is capable of performing a full complement of Boolean functions, and is further capable of communicating with at least the processing elements orthogonally neighboring it on each side, hereinafter referenced as north, south, east, and west.

Figure 2:
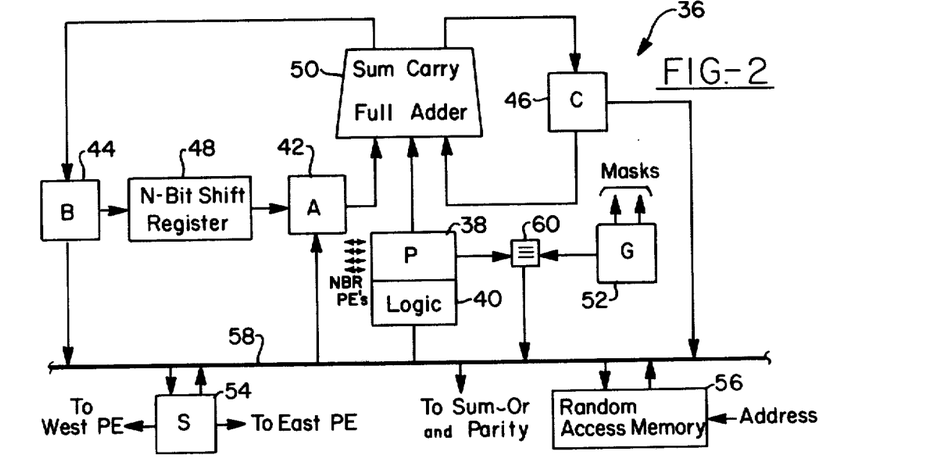
FIG. 2 is a block diagram of a single processing element, comprising the basic building block of the array unit of FIG. 1.

With specific reference now to FIG. 2, it can be seen that a single processing element is designated generally by the numeral 36. The processing element itself includes a P register 38 which, together with its input logic 40, performs all logic and routing functions for the processing element 36. The A, B, and C registers 42–46, the variable length shift register 48 and the associated logic of the full adder 50 comprise the arithmetic unit of the processing element 36. The G register 52 is provided to control masking of both arithmetic and logical operations, while the S register 54 is used to shift data into and out of the processing element 36 without disturbing operations thereof. Finally, the aforementioned elements of the processing element 36 are connected to a uniquely associated random access memory 56 by means of a bi-directional data bus 58.

As presently designed, the processing element 36 is reduced by large scale integration to such a size that a single chip may include eight such processing elements along with a parity tree, a sum-or circuit, and associated control decode. In the preferred embodiment of the invention, the eight processing elements on a chip are provided in a two row by four column arrangement. Since the size of random access memories presently available through large scale integration is rapidly changing, it is preferred that the memory 56, while comprising a portion of the processing element 36, be maintained separate from the integrated circuitry of the remaining structure of the processing elements such that, when technology allows, larger memories may be incorporated with the processing elements without altering the total system design.

The data bus 58 is the main data path for the processing element 36. During each machine cycle it can transfer one bit of data from any one of six sources to one or more destinations. The sources include a bit read from the addressed location in the random access memory 56, the state of the B, C, P, or S registers, or the state of the equivalence function generated by the element 60 and indicating the state of equivalence existing between the outputs of the P and G registers. The equivalence function is used as a source during a masked-negate operation.

The destinations of a data bit on the data bus 58 are the addressed location of the random access memory 56, the A, G, or S registers, the logic associated with the P register, the input to the sum-or tree, and the input to the parity tree.

Figure 3A:
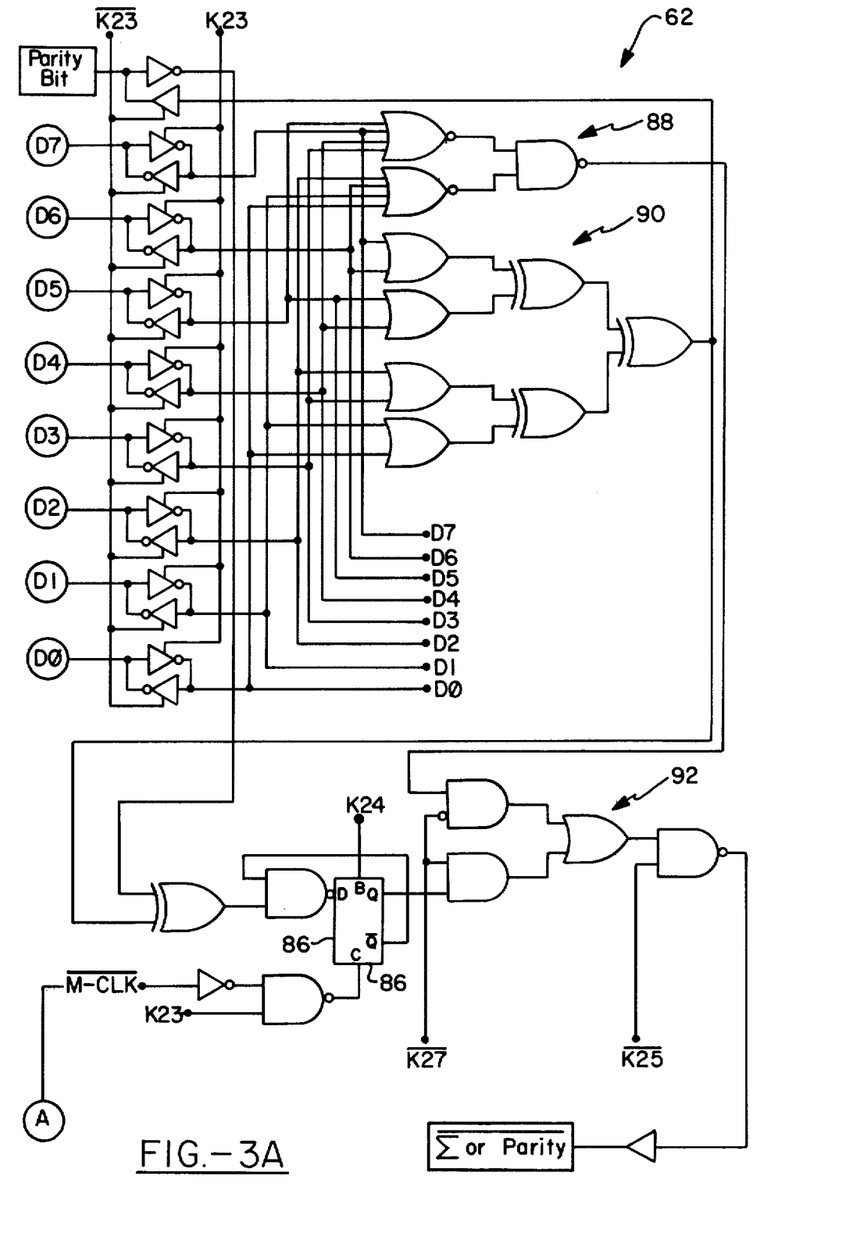
FIG. 3, consisting of FIGS. 3A–3C, constitutes a circuit schematic of the control signal generating circuitry of the processing elements maintained upon a chip and including the sum-or and parity trees.
Figure 3B:
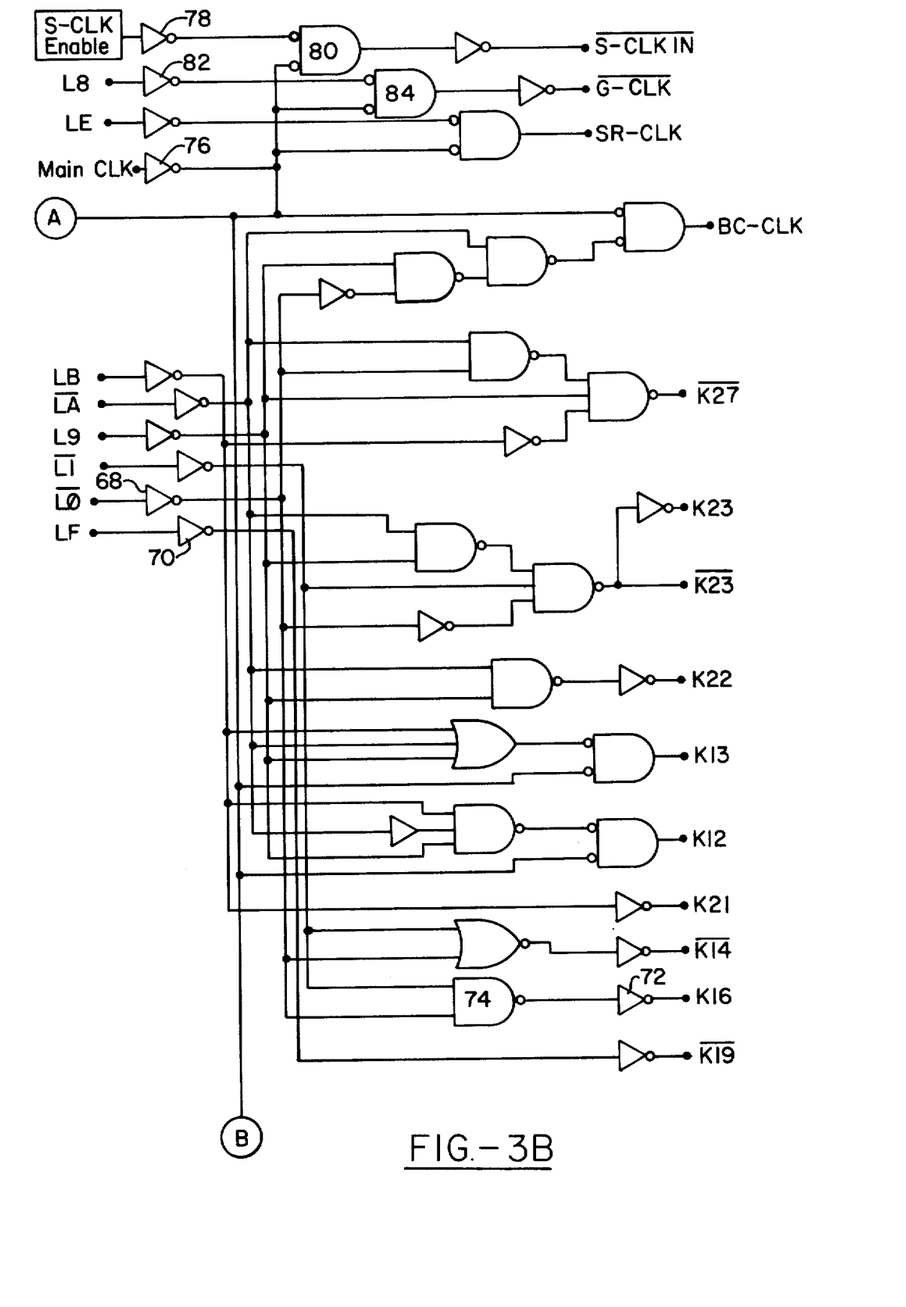
Figure 3C:
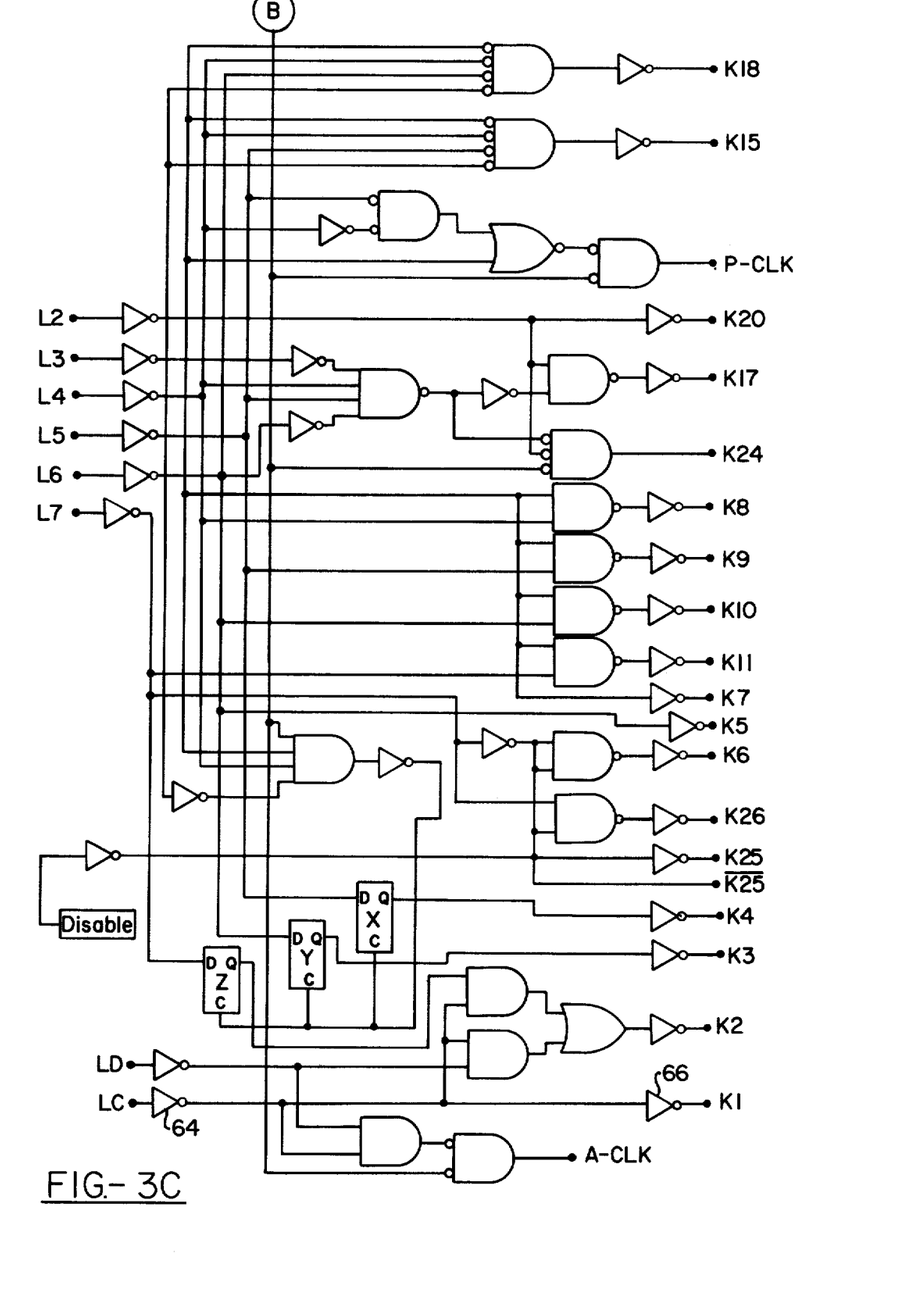

Before considering the detailed circuitry of the processing element 36, attention should be given to FIG. 3 wherein the circuitry 62 for generating the control signals for operating the processing elements is shown. The circuitry of FIG. 3 is included in a large scale integrated chip which includes eight processing elements, and is responsible for controlling those associated elements. Fundamentally, the circuitry of FIG. 3 includes decode logic receiving control signals on lines L0-LF under program control and converts those signals into the control signals K1-K27 for application to the processing elements 36, sum-or tree, and parity tree. Additionally, the circuitry of FIG. 3 generates from the main clock of the system all other clock pulses necessary for control of the processing element 36.

One skilled in the art may readily deduce from the circuitry of FIG. 3 the relationship between the programmed input function on the lines L0-LF and the control signals K1-K27. For example, the inverters 64,66 result in K1=LC. Similarly, inverter 68-72 and NAND gate 74 result in K16=L0·L1. By the same token, K18=L2·L3·L4·L6.

Clock pulses for controlling the processing elements 36 are generated in substantially the same manner as the control signals. The same would be readily apparent to those skilled in the art from a review of the circuitry 62 of FIG. 3. For example, the clock S-CLK=S-CLK-ENABLE·MAIN CLK by virtue of inverters 76,78 and NAND gate 80. Similarly, clock G-CLK=L8·MAIN CLK by virtue of inverters 76,78 and NAND gate 84.

With further respect to the circuitry 62 of FIG. 3, it can be seen that there is provided means for determining parity error and the sum-or of the data on the data bus of all processing elements. The data bit on the data bus may be presented to the sum-or tree, which is a tree of inclusive-or logic elements which forms the inclusive-or of all processing element data bus states and presents the results to the array control unit 20.

In order to detect the presence of processing elements in certain states, groups of eight processing elements are ORed together in an eight input sum-or tree whose output is then fed to a 2048-input or-tree external to the chip to achieve a sum-or of all 16,384 processing elements.

Errors in the random access memory 56 may be determined in standard fashion by parity-generation and checking circuitry. With each group of eight processing elements 36 there is a parity-error flip-flop 86 which is set to a logic 1 whenever a parity error is detected in an associated random access memory 56. As shown in the circuitry 62, the sum-or tree comprises the three gates designated by the numeral 88 while the parity error tree consists of the seven exclusive -OR gates designated by the numeral 90. During read operations, the parity output is latched in the flip-flop 86 at the end of the cycle by the M-clock. During write operations, parity is outputted to a parity memory through the parity-bit pin of the chip. The parity memory comprises a ninth random access memory similar to the elements 56. The parity state stored at the parity bit during write operations is exclusive -ORed with the output of the parity tree 90 during read operations to affect the latch 86.

As shown, control signal K23 determines whether a read or write operation is being performed, while K24 is used for clearing the parity-error flip-flop 86. The sum-or tree 88 OR's all of the data bits D0-D7 on the associated data bus lines of the eight processing elements 36 of the chip. As can be seen, both the parity outputs and the sum-or outputs are transferred via the same gating matrix 92, which is controlled by K27 to determine whether parity or sum-or will be transferred from the chip to the array control unit 20. The outputs of the flip-flops 86 of each of the processing elements are connected to the 2048 input sum-or tree such that the presence of any set flip-flop 86 might be sensed. By using a flip-flop which latches upon an error, the array control unit 20 can sequentially disable columns of processing elements until that column containing the faulty element is found.

Finally, and as will be discussed further hereinafter, control signal K25 is used to disable the parity and sum-or outputs from the chip when the chip is disabled and no longer used in the system.

While the utilization of sum-or and parity functions are known in the art, their utilization in the instant invention is important to assist in locating faulty processing elements such that those elements may be removed from the operative system. The trees 88,90, mutually exclusively gated via the network 92, provide the capability for columns of processing elements 36 to be checked for parity and further provides the sum-or network to determine the presence of processing elements in particular logic states, such as to determine the responder to a search operation. The number of circuit elements necessary for this technique have been kept to a minimum by utilizing a single output for the two trees, with that output being multiplexed under program control.

With final attention to FIG. 3, it can be seen that the disable signal, utilized for removing an entire column of processing element chips from the array unit 12, generates the signal K25,K26 for this purpose. As mentioned above, the control signal K25 disables the sum-or and parity outputs for associated processing elements. Further functions of the signals K25,K26 with respect to removing selected processing elements will be discussed with respect to FIG. 5 hereinafter.

Figure 4:
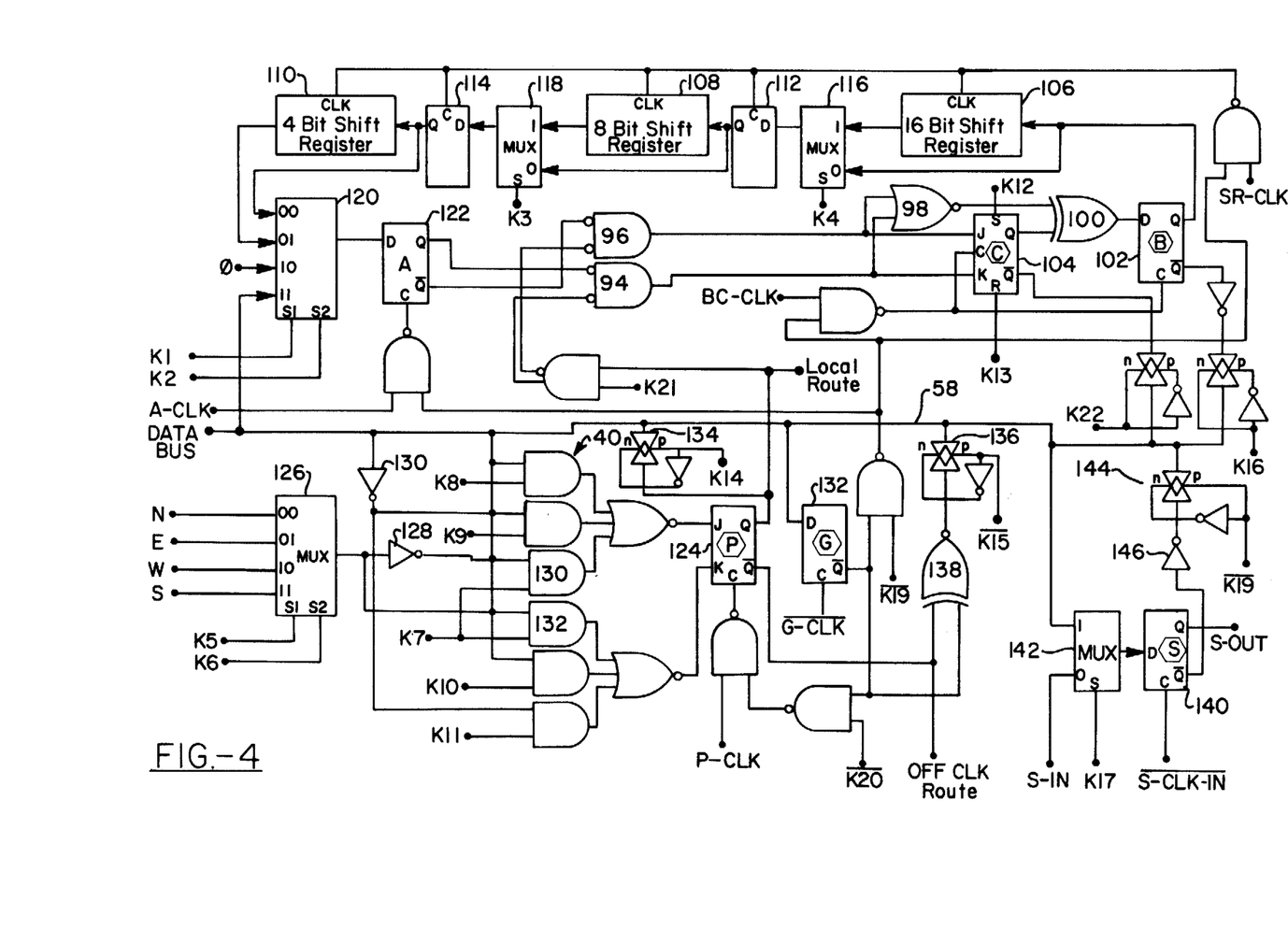
FIG. 4 is a detailed circuit schematic of the fundamental circuitry of a processing element of the invention.

With reference now to FIG. 4, and correlating the same to FIG. 2, it can be seen that the full adder of the invention comprises logic gates 94-100. This full adder communicates with the B register comprising flip-flop 102 which receives the sum bit, the C register which comprises flip-flop 104 which receives the carry bit, and further communicates with the variable length shift register 48 which comprises 16, 8, and 4 bit shift registers 106-110, flip-flops 112,114, and multiplexers 116-120.

The adder receives an input from the shift register, the output of the A register 122, and an input from the logic and routing sub-unit the output of the P register 124. Whenever control line K21 is a logic 1 and BC-CLK is clocked, the adder adds the two input bits from registers A and P to the carry bit stored in the C register 104 to form a two-bit sum. The least significant bit of the sum is clocked into the B register 102 and the most significant bit of the sum is clocked into the C register 104 so that it becomes the carry bit for the next machine cycle. If K21 is at a logic 0, a 0 is substituted for the P bit.

As shown, control line K12 sets the C register 104 to the logic 1 state while control line K13 resets the C register to the logic 0 state. Control line K16 passes the state of the B register 102 onto the bi-directional data bus 58, while control line K22 transfers the output of the C register to the data bus.

In operation, the full adder of FIG. 4 incorporates a carry function expressed as follows:

$$C \leftarrow AP \vee PC \vee AC.$$

The new state of the carry register C, flip-flop 104, is equivalent to the states of the A and P registers ANDed together, or the states of the P and C registers ANDed together, or the states of the A and C registers ANDed together. This carry function is achieved, notwithstanding the fact that there is no feedback of C register outputs to C register inputs, because the JK flip-flop 104 follows the rule:

$$C \leftarrow J\bar{C} \vee \bar{K}C.$$

The new state of the C register is the complement of the present state of the C register ANDed with the J input or the complement of the K input ANDed with the present state of the C register. Accordingly, in the circuit of FIG. 4, the flip-flop 104 follows the rule:

$$C \leftarrow AP\bar{C} \vee (A \vee P)C.$$

The expression immediately above is equivalent to the carry function first given.

With respect to the sum expression, the B register, flip-flop 102, receives a sum bit which is an exclusive OR function of the states of the A, P, and C registers according to the expression:

$$B \leftarrow A \oplus P \oplus C.$$

The gate 98 generates $A \oplus P$ from gates 94 and 96 which gates 100 exclusive OR's that result with C to achieve the sum expression.

The shift register of the arithmetic unit of the processing element 36 has 30 stages. These stages allow for the shift registers to have varying lengths so as to accommodate various word sizes, substantially reducing the time for arithmetic operations in serial-by-bit calculations, such as occur in multiplication. Control lines K1–K4 control multiplexers 116–120 so that certain parts of the shift register may be bypassed, causing the length of the shift register to be selectively set at either 2, 6, 10, 14, 18, 22, 26, or 30 stages. Data bits are entered into the shift register through the B register 102, these being the sum bits from the adder. The data bits leave the shift register through the A register 122 and recirculate back through the adder. The A and B registers add two stages of delay to the round-trip path. Accordingly, the round-trip length of an arithmetic process is either 4, 8, 12, 16, 20, 24, 28, or 32 stages, depending upon the states of the control lines K1–K4 as they regulate the multiplexers 112–120.

The shift register outputs data to the A register 122 which has two other inputs selectable via control lines K1,K2, and multiplexer 120. One input is a logic 0. This is used to clear the shift register to an all-zero state. The other input is the bi-directional data bus 58. This may be used to enter data directly into the adder.

The A register 122 is clocked by A-CLK, and the other thirty stages of the shift register are clocked by SR-CLK. Since the last stage of the shift register has a separate clock, data from the bi-directional data bus 58 or logic 0 may be entered into the adder without disturbing data in the shift register.

As discussed above, the P register 124 provides an input to the adder 50 with such input being supplied from one of the orthogonally contiguous processing elements 36, or from the data bus 58. Data is received by the P register 124 from the P register of neighboring processing elements 36 by means of the multiplexer 126 under control of control signals K5,K6. In transferring data to the P register 124 from the multiplexer 126, transfer is made via inverter 128 and ND gates 130,132. The transfer is effectuated under control of the control signal K7 to apply the true and complement of the data to the J and K inputs respectively of the flip-flop 124. The data is latched under control of the clock P-CLK. As noted, the true and complement outputs of the P flip-flop 124 are also adapted to be passed to the P flip-flops of neighboring processing elements 36. The complement is passed off of the chip containing the immediate processing element, but is inverted by a driver at the destination to supply the true state of the P flip-flop. The true state is not inverted and is applied to neighboring processing elements on the same chip. The logic circuitry 40 is shown in more detail in FIG. 4 to be under control of control lines K8–K11. This logic receives data from the data bus 58 either in the true state or complementary through the inverter 130. The logic network 40, under control of the control signals K8–K11, is then capable of performing all sixteen Boolean logic functions which may be performed between the data from the data bus and that maintained in the P register 124. The result is then stored in the P register 124.

It will be understood that with K7=0, gates 130,132 are disabled. Control lines K8 and K9 then allow either 0, 1, D, or $\bar{D}$ to be gated to the J input of the P register, flip-flop 124. D is the state of the data bus 58. Independently, control lines K10 and K11 allow 0, 1, D or $\bar{D}$ to be sent to the K input. Following the rule of J-K flip-flop operation, the new state of the P register is defined as follows:

$$P \leftarrow J\bar{P} \vee \bar{K}P.$$

As can be seen, in selecting all four states of J and all four states of K, all sixteen logic functions of P and D can be obtained.

As discussed above, the output of the P register may be used in the arithmetic calculations of the processing elements 36, or may be passed to the data bus 58. If K21 is at a logic 1, the current state of the P register is enabled to the adder logic. If $\overline{K14}$ is a logic 0, the output of the P register is enabled to the data bus. If $\overline{K15}$ is at a logic 0, the output of the P register is exclusively OR'ed with the complement of the G register 132, and the result is enabled to the data bus. It will be noted that certain transfers to the data bus are achieved via bi-directional transmission gates 134,136, respectively enabled by control signals $\overline{K14}$ and $\overline{K15}$. These types of gates are well known to those skilled in the art.

The mask register G, designated by the numeral 132, comprises a simple D-type flip-flop. The G register reads the state of the bi-directional data bus on the positive transition of $\overline{G\text{-}CLK}$. Control line $\overline{K19}$ controls the masking of the arithmetic sub-unit clocks (A-CLK, SR-CLK, and BC-CLK). When $\overline{K19}$ equals 1, these clocks will only be sent to the arithmetic sub-units of those processing elements where G=1. The arithmetic sub-units of those processing elements where G=0 will not be clocked and no register and no sub-units will change state. When $\overline{K19}$=0, the arithmetic sub-units of all processing elements will participate in the operation.

Control line $\overline{K20}$ controls the masking of the logic and routing sub-unit. When $\overline{K20}=1$, the clock P-CLK is only sent to the logic and routing sub-units of those processing elements where G=1. The logic and routing sub-units of those processing elements where G=0 will not be clocked and their P registers will not change state.

Translation operations are masked when control line $\overline{K20}=1$. In those processing elements where G=1, the P register is clocked by P-CLK and receives the state of its neighbor. In those where G=0, the P register is not clocked and does not change state. Regardless of whether G=0 or G=1, each processing element sends the state of its P register to its neighbors.

Brief attention is now given to the equivalence function provided for by the inclusive OR gate 138, which provides a logic 1 output when the inputs thereof from the P and G registers are of common logic states. In other words, the gate 138 provides the output function of $P \oplus \overline{G}$. This result is then supplied to the data bus.

The S register comprises a D-type flip-flop 140 with the input thereto under control of the multiplexer 142. The output from the S register is transmitted to the data bus 58 by means of the bi-directional transmission gate 144. The flip-flop 140 reads the state of its input on the transition of the clock pulse $\overline{\text{S-CLK-IN}}$. When control line K17 is at a logic 0, the multiplexer 142 receives the state of the S register of the processing element immediately to the west. In such case, each $\overline{\text{S-CLK-IN}}$ pulse will shift the data in the S registers one place to the east. To store the state of the S register 140 in local memory, control line $\overline{K18}$ is set to a logic 0 to enable the bi-directional transmission gate 144 to pass the complementary output of the S register 140 through the inverter 146 and to the data bus 58. The S register 140 may be loaded with a data bit from the local memory 56 by setting K17 to a logic 1, and thus enabling the data bus 58 to the input of the flip-flop 140.

As mentioned hereinabove, a particular attribute of the massively-parallel processor 10 is that the array unit 12 is capable of bypassing a set of columns of processing elements 36 should an error or fault appear in that set. As discussed earlier herein, each chip has two processing elements 36 in each of four columns of the array unit matrix. The instant invention disables columns of chips and, accordingly, sets of columns of processing elements. Fundamentally, the columns are dropped out of operation by merely jumping the set of columns by interconnecting the inputs and outputs of the east-most and west-most processing elements on the chips establishing the set of columns. The method of inhibiting the outputs of the sum-or tree and the parity tree of the chips have previously been described. However, it is also necessary to bypass the outputs of the P and S registers which intercommunicate between the east and west neighboring chips.

Figure 5A:
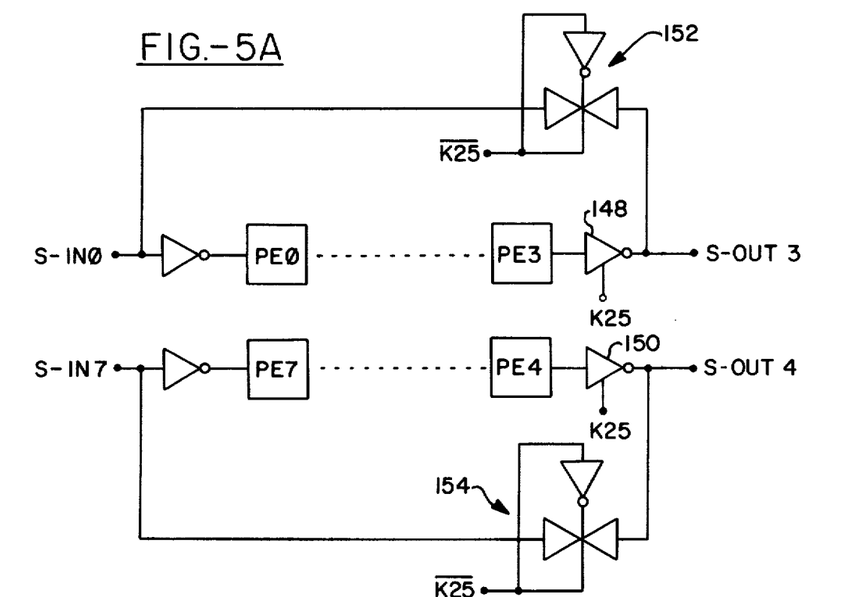

As shown in FIG. 5A, a chip includes eight processing elements, PE0–PE7, arranged as earlier described. The S register of each processing element may receive data from the S register of the processing element immediately to the west and may transfer data to the S register of the processing element immediately to the east. When enabled, the chip allows data to flow from S-IN0, through the S registers of PE0–PE3 and then out of S-OUT3 to the neighboring chip. Similar data flow occurs from S-IN7 to S-OUT4. When it is desired to disable a column of chips, the output gates of the column of chips which pass the S register data to the neighboring east chip are disabled. That is, control signal K25 may inhibit output gates 148,150 while concurrently enabling the bypass gates 152,154. This interconnects S-IN0 with S-OUT3 and S-IN7 with S-OUT4, for all chips in the column.

Figure 5B:
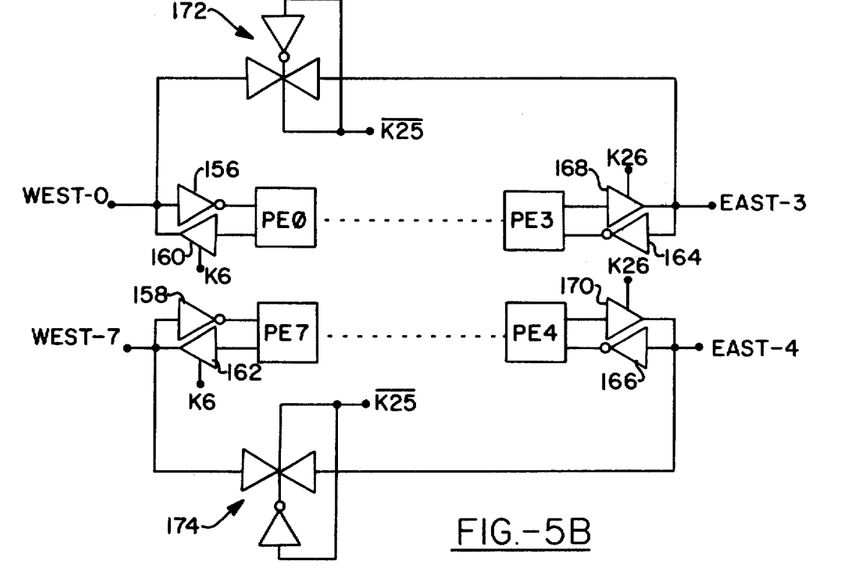

In FIG. 5B it can be seen that communications between the P registers of east-west neighboring chips may also be bypassed. P register data is received from the chip to the west via inverters 156,158 and is transmitted thereto by gates 160,162. Similarly, P register data is received from the chip to the east via inverters 164,166 and is transmitted thereto via gates 168,170. If the chip is enabled and P register data is to be routed to the west, then control line K6 is set to a logic 1 and K26 to a logic 0 so gates 160,162 are enabled and gates 168,170 are disabled. When routing to the east, K6 is set to zero and K26 to one. To disable the chip, K6 and K26 are both set to a logic 0 to disable all P register east-west outputs from the chip and K25 is set to allow the bi-directional bypass gates 172,174 to interconnect WEST-0 with EAST-3 and WEST-7 with EAST-4. This connects the P registers of PE3 of the west chip with PE0 of the east chip and PE4 of the west chip with PE7 of the east chip.

By disabling the parity and sum-or trees and by jumping the inputs and outputs of bordering P and S registers of the chips in a column, an entire column of chips may be removed from service if a fault is detected. It will be understood that while the processing elements of the disabled chips do not cease functioning when disabled, the outputs thereof are simply removed from effecting the system as a whole. Further, it will be appreciated that, by removing columns, no action need be taken with respect to intercommunication between north and south neighbors. Finally, by removing entire chips rather than columns of processing elements, the amount of bypass gating is greatly reduced.

In the preferred embodiment of the invention, the array unit 12 has 128 rows and 132 columns of processing elements 36. In other words, there are 64 rows and 33 columns of chips. Accordingly, there is an extra column of chips beyond those necessary for achieving the desired square array. This allows for the maintenance of a square array even when a faulty chip is found and a column of chips are to be removed from service.

Thus it can be seen that the objects of the invention have been satisfied by the structure presented hereinabove. A massively-parallel processor, having a unique array unit of a large plurality of interconnected and intercommunicating processing elements achieved rapid parallel processing. A variable length shift register allows serial-by-bit arithmetic computations in a rapid fashion, while reducing system cost. Each processing element is capable of performing all requisite mathematical computations and logic functions and is further capable of intercommunicating not only with neighboring processing elements, but also with its own uniquely associated random access memory. Provisions are made for removing an entire column of processing chips wherein at least one processing element has been found to be faulty. All of this structure leads to a highly reliable data processor which is capable of handling large magnitudes of data in rapid fashion.

While in accordance with the patent statutes, only the best mode and preferred embodiment of the invention has been presented and described in detail, it is to be understood that the invention is not limited thereto or thereby. Consequently, for an appreciation of the true scope and breadth of the invention, reference should be had to the following claims.

What is claimed is:

1. A matrix of a plurality of processing elements interconnected with each other and wherein each processing element comprises:
   a memory;
   an adder;
   a selectably variable length shift register operatively connected to said adder, said shift register comprising a plurality of individual shift registers having gates interposed therebetween, said gates selectively interconnecting said individual shift registers; and
   communication means connected to neighboring processing elements within said matrix and further connected to said adder and memory for transferring data between said memory, adder, and neighboring processing elements.

2. The matrix according to claim 1 wherein each said processing element further includes a sum register and a carry register operatively connected to said adder.

3. The matrix according to claim 2 wherein said carry register comprises a J-K flip-flop.

4. The matrix according to claim 1 wherein each said processing element includes a logic network capable of performing the sixteen logic functions of two bits of data, said logic network including a single JK flip-flop.

5. The matrix according to claim 1 wherein said processing elements are interconnected in groups, the processing elements of each group communicating with each other, each group being operatively connected to neighboring groups for communication therewith, and wherein each group includes means for removing the processing elements thereof from communication with neighboring groups.

6. The matrix according to claim 5 wherein said means for removing comprises bi-directional switches interconnecting inputs and outputs of said group.

7. The matrix according to claim 5 wherein each said group includes a sum-or tree of a plurality of OR gates receiving data bits from a data bus of each processing element within said group and a parity tree of a plurality of exclusive OR gates receiving data bits from each such data bus within said group, the outputs of said OR gates and said exclusive OR gates being mutually exclusively connected to a single output.

8. The matrix according to claim 7 wherein said exclusive OR gates of said parity tree are connected to a flip-flop.

9. The matrix according to claim 7 wherein each said group further includes disable means connected to said sum-or tree and parity tree for selectively enabling and inhibiting outputs therefrom.

10. An array of a plurality of processing elements interconnected with each other and wherein each processing element comprises:
    an adder;
    first and second data registers connected with and supplying data bits to said adder;
    a carry register connected to said adder and receiving therefrom data bits resulting from arithmetic operations and which functions according to the rule: $C \leftarrow AP \vee PC \vee AC$ where A is the state of said first register, P is the state of said second register, and C is the state of said carry register;
    a memory; and
    a data bus interconnecting said first, second, and carry registers and said memory for the transfer of data thereamong.

11. The array as recited in claim 10 wherein each processing element further includes a shift register of selectably variable length interconnected between said first data register and said adder.

12. The array as recited in claim 11 wherein said carry register comprises a J-K flip-flop.

13. The array as recited in claim 12 wherein each processing element further includes a sum register interconnected between said shift register and said adder, said sum register functioning according to the rule $B \leftarrow A \oplus P \oplus C$, where B, A, P, and C are respectively the states of said sum, first, second, and carry registers.

14. The array as recited in claim 10 wherein each said processing element includes logic means interconnected with said second register for performing the sixteen logic functions possible between the data of said second register and a data bit from said data bus.

15. The array as recited in claim 10 wherein said second register of each said processing element is communicatingly interconnected with said second register of orthogonally neighboring processing elements within the array.

* * * * *